(12) United States Patent
Coffey et al.

(10) Patent No.: US 11,410,931 B2
(45) Date of Patent: Aug. 9, 2022

(54) CRYSTALLOGRAPHIC ORIENTATIONS OF RUTHENIUM FILMS

(71) Applicants: UNIVERSITY OF CENTRAL FLORIDA RESEARCH FOUNDATION, INC., Orlando, FL (US); The Trustees of Columbia University in the City of New York, New York, NY (US)

(72) Inventors: Kevin R. Coffey, Oviedo, FL (US); Edward Dein, Saint Cloud, FL (US); Sameer Ezzat, Mosul (IQ); Prabhu Doss Mani, Memphis, TN (US); Katayun Barmak, Elmsford, NY (US)

(73) Assignees: University of Central Florida Research Founation, Inc., Orlando, FL (US); The Trustees of Columbia University in the City of New York, New York, NY (US)

( * ) Notice: Subject to any disclaimer, the term of this patent is extended or adjusted under 35 U.S.C. 154(b) by 73 days.

(21) Appl. No.: 16/896,356

(22) Filed: Jun. 9, 2020

(65) Prior Publication Data
US 2021/0384138 A1 Dec. 9, 2021

(51) Int. Cl.
*H01L 23/532* (2006.01)
*H01L 21/3205* (2006.01)
*H01L 23/528* (2006.01)

(52) U.S. Cl.
CPC .. *H01L 23/53257* (2013.01); *H01L 21/32051* (2013.01); *H01L 23/528* (2013.01); *H01L 23/53214* (2013.01)

(58) Field of Classification Search
CPC ......... H01L 23/53257; H01L 21/32051; H01L 23/528; H01L 23/53214; H01L 21/4846; H01L 23/498; H01L 21/76885; H01L 23/53242; H01L 23/53252; H01L 28/65
See application file for complete search history.

(56) References Cited

U.S. PATENT DOCUMENTS

| 9,117,821 B2 | 8/2015 | Barmak Vaziri et al. |
| 2004/0072028 A1* | 4/2004 | Ohsawa ................. G11B 5/656 9/5.24 |
| 2009/0303657 A1* | 12/2009 | Bhat ................. H01L 21/02183 361/321.5 |

* cited by examiner

*Primary Examiner* — Thanhha S Pham
(74) *Attorney, Agent, or Firm* — Withrow & Terranova, P.L.L.C.

(57) ABSTRACT

Crystallographic orientations of ruthenium films and related methods are disclosed. Single crystal ruthenium films are provided with crystallographic orientations that arrange a c-axis of the ruthenium crystal structure in a direction that corresponds with a plane of the film or along a direction that corresponds with a surface of a substrate on which the film is formed. While ruthenium films typically form with the c-axis perpendicular to the surface of the substrate or as a polycrystalline film with a random crystallographic orientation, substrate surfaces may be configured with a crystallographic surface net that promotes non-perpendicular c-axis orientations of ruthenium. The substrate may be formed with a metal-terminated surface in certain arrangements. In this regard, ruthenium films may be configured as metallic interconnects for devices where directions of lowest electrical resistivity within the crystal structure are arranged to correspond with the direction of current flow in the devices.

26 Claims, 5 Drawing Sheets

CRYSTALLOGRAPHIC ORIENTATIONS OF RUTHENIUM FILMS

GOVERNMENT SUPPORT

This invention was made with government support under Grant No. HR0011-18-3-0004 awarded by the Department of Defense/Defense Advanced Research Projects Agency (DARPA) and 1740228 awarded by the National Science Foundation. The government has certain rights in the invention.

FIELD OF THE DISCLOSURE

The present disclosure relates to ruthenium films and more particularly to crystallographic orientations of ruthenium films and related methods.

BACKGROUND

The resistivity size effect refers to the phenomenon by which there is an increase in electrical resistivity with decreasing conductor dimension(s). The resistivity size effect in metals was first observed in 1901, and the basic physics was understood by the mid-twentieth century. However, the phenomenon has seen a recent resurgence of interest as a result of the severe resistivity increase observed in nanoscale copper (Cu) wires that serve as interconnects in semiconductor device technology.

The resistivity size effect is typically attributed to the momentum loss of carriers along the axis of the conductors due to surface scattering (evidenced by the film-thickness/line-width dependence of resistivity) and grain boundary scattering (evidenced by the grain size dependence of resistivity). The two most widely used physical models for these scattering mechanisms are the Fuchs-Sondheimer (FS) surface scattering model, incorporating a specularity parameter, p, in the range of 0-1 for diffuse vs. specular scattering from surfaces, and the Mayadas-Shatzkes (MS) grain boundary scattering model, incorporating a reflection coefficient, R, in the range of 0-1 for scattering from grain boundaries.

As advancements in modern semiconductor technology progress, the art continues to seek improved materials having desirable resistivity characteristics capable of overcoming challenges associated with conventional semiconductor devices.

SUMMARY

The present disclosure relates to crystallographic orientations of ruthenium films and related methods. Single crystal ruthenium films are provided with crystallographic orientations that arrange a c-axis of a ruthenium crystal structure in a direction that corresponds with a plane of the film or along a direction that corresponds with a surface of a substrate on which the film is formed. While ruthenium films typically form with the c-axis perpendicular to the surface of the substrate or as a polycrystalline film with a random crystallographic orientation, substrate surfaces may be configured with a crystallographic surface net that promotes non-perpendicular c-axis orientations of ruthenium. The substrate may be formed with a metal-terminated surface in certain arrangements. In this regard, ruthenium films may be configured for applications with optical, mechanical, electrical or other properties within the crystal structure that are anisotropic in the plane of the film. For example, when configured as metallic interconnects for semiconductor devices, the directions of highest electrical conductivity or lowest electrical resistivity within the crystal structure can be arranged to correspond with the direction of current flow in the semiconductor devices.

In one aspect, a device comprises: a substrate comprising a first face and a second face that opposes the first face; and a ruthenium film on the first face, the ruthenium film comprising a first surface and a second surface that opposes the first surface, the first surface being arranged closer to the first face of the substrate than the second surface, and the ruthenium film comprising an epitaxial film with a crystallographic orientation such that a c-axis of the ruthenium film is no more than 10 degrees from parallel to the second surface. In certain embodiments, the c-axis is parallel to the second surface. In certain embodiments, the substrate comprises sapphire and the first face of the substrate comprises a metal-terminated surface. The metal-terminated surface may comprise a crystallographic surface net that is configured to provide the crystallographic orientation of the ruthenium film. The crystallographic surface net may comprise a rectangular surface net and the ruthenium film may comprise a rectangular surface net at the second surface. In certain embodiments, the metal-terminated surface comprises aluminum or chromium. In certain embodiments, the substrate comprises silicon and a silicide and the first face is a surface of the silicide. The ruthenium film may comprise a single crystalline layer of ruthenium. In certain embodiments, the ruthenium film comprises a $(11\bar{2}0)$ crystallographic orientation or a $(10\bar{1}0)$ crystallographic orientation. The ruthenium film may form an interconnect wire for the device.

In another aspect, a device comprises: a substrate comprising a first face and a second face that opposes the first face; and a ruthenium film on the first face, the first face comprising a crystallographic surface net that is configured to provide a crystallographic orientation of the ruthenium film such that a c-axis of the ruthenium film is no more than 10 degrees from parallel to the first face. In certain embodiments, the c-axis is parallel to the second face. In certain embodiments, the substrate comprises sapphire and the first face of the substrate comprises a metal-terminated surface. The metal-terminated surface may comprise one of aluminum and chromium.

In another aspect, a method of forming a device comprises: providing a substrate comprising a first face and a second face that opposes the first face; and providing a ruthenium film on the first face, the ruthenium film comprising a first surface and a second surface that opposes the first surface, the first surface being arranged closer to the first face of the substrate than the second surface, and the ruthenium film comprising an epitaxial film with a crystallographic orientation such that a c-axis of the ruthenium film is no more than 10 degrees from parallel to the second surface. In certain embodiments, the c-axis is parallel to the second surface. In certain embodiments, the substrate comprises sapphire and the method further comprises providing a metal-terminated surface at the first face of the substrate. The metal-terminated surface may comprise a crystallographic surface net that is configured to provide the crystallographic orientation of the ruthenium film. In certain embodiments, providing the metal-terminated surface comprises supplying a metal to the first face of the substrate. The metal may comprise at least one of aluminum or chromium. In certain embodiments, supplying the metal to the first face of the substrate and providing the ruthenium film are performed in consecutive steps within a same deposition system. In certain embodiments, providing the metal-terminated surface comprises removing oxygen from the first face of the substrate.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to crystallographic orientations of ruthenium films and related methods. Single crystal ruthenium films are provided with crystallographic orientations that arrange a c-axis of a ruthenium crystal structure in a direction that corresponds with a plane of the film or along a direction that corresponds with a surface of a substrate on which the film is formed. While ruthenium films typically form with the c-axis perpendicular to the surface of the substrate or as a polycrystalline film with a random crystallographic orientation, substrate surfaces may be configured with a crystallographic surface net that promotes non-perpendicular c-axis orientations of ruthenium. The substrate may be formed with a metal-terminated surface in certain arrangements. In this regard, ruthenium films may be configured for applications with optical, mechanical, electrical or other properties within the crystal structure that are anisotropic in the plane of the film. For example, when configured as metallic interconnects for semiconductor devices, the directions of highest electrical conductivity or lowest electrical resistivity within the crystal structure can be arranged to correspond with the direction of current flow in the semiconductor devices.

Ruthenium is an elemental metal of interest for use in semiconductor devices due to its relatively low resistivity and high melting temperature. Low resistivity is advantageous for use in interconnect wires of semiconductor devices and a high melting temperature may provide improved reliability due to reduced diffusivity at microprocessor or electronic device operating conditions. Ruthenium typically has a hexagonal close-packed (hcp) crystallographic structure that provides for crystallographic anisotropy of certain properties. Notably, crystallographic planes of ruthenium that are perpendicular to the c-axis have decreased surface energy, and electrical current flowing in a direction that is parallel to the c-axis has lower resistivity. Such anisotropy of surface energy and resistivity characteristics may also correspond with anisotropy of an electron mean free path within the crystallographic structure. In this regard, the resistivity size effect may be mitigated along certain crystallographic planes, thereby providing ruthenium with further desirable characteristics for use as interconnects or electrical connections in modern semiconductor devices. While ruthenium may have a higher bulk resistivity as compared with conventional interconnect metals such as copper, ruthenium demonstrates substantially reduced electrical resistivity along certain crystal directions. Additionally, the directional resistivity improvements related to anisotropy of an electron mean free path are maintained at both macroscopic scales and at the nanoscale for ruthenium. In contrast, other alternative materials to copper, such as tungsten, may only exhibit anisotropy of an electron mean free path at the nanoscale.

Ruthenium is typically formed according to a variety of polycrystalline and single crystalline structures. In some applications, polycrystalline ruthenium can form with a random orientation of individual crystallites. In other applications, polycrystalline ruthenium can form with planes of lower surface energy parallel to film layers, thereby providing preferential orientation of crystallites with a c-axis normal to a substrate on which the ruthenium is formed. In a similar manner, single crystalline films of ruthenium also tend to form with a c-axis normal to a substrate according to crystal planes of lower surface energy. In this regard, typical polycrystalline and single crystalline films of ruthenium preferentially form with a c-axis that is perpendicular to a substrate plane, thereby providing the lower resistivity direction in an orientation that is also perpendicular to the planes of the substrate. As such, crystallographic orientations of typical ruthenium films are not preferred for conducting point-to-point electricity along directions parallel to substrate planes that are common in semiconductor metal interconnects.

According to embodiments disclosed herein, single crystal ruthenium films are provided with crystallographic orientations that arrange the c-axis of the ruthenium crystal structure in a direction that is along the film plane or along a direction that is generally parallel to a surface of a substrate on which the film is formed. In this regard, ruthenium films as disclosed herein may be referred to as c-axis in-plane films. In certain embodiments, the c-axis is arranged to be no more than about 10 degrees from parallel to a film plane. In still further embodiments, the c-axis is arranged to be parallel to a film plane. As described in greater detail below, such ruthenium films may be provided by configuring a face or surface of a substrate with a crystallographic surface net that promotes c-axis in-plane crystallographic orientations. Such crystallographic orientations may be well suited to provide anisotropic characteristics for ruthenium films including one or more of anisotropic electrical, optical, and mechanical properties.

As previously described, ruthenium films preferentially form with the c-axis perpendicular to a film plane. In certain embodiments, a substrate on which a ruthenium film is formed comprises single crystalline sapphire. Various orientations of sapphire substrates, including (11$\bar{2}$0) and (10$\bar{1}$0) orientations, typically include surfaces that terminate with oxygen, thereby providing a crystallographic surface net that is substantially hexagonal. As such, the crystallographic surface net of the sapphire substrate can more closely match a hexagonal crystallographic surface net of the (0001) crystallographic plane of ruthenium, thereby promoting ruthenium films to form with orientations having the c-axis out of the film plane, or perpendicular to the surface or plane of the substrate. According to embodiments disclosed herein, a face or surface of the substrate may be altered to provide a different crystallographic surface net, such as a rectangular crystallographic surface net that more closely corresponds with (11$\bar{2}$0) and (10$\bar{1}$0) crystallographic planes of ruthenium.

In certain embodiments that include insulating substrates such as (11$\bar{2}$0) or (10$\bar{1}$0) orientations of sapphire, the altered crystallographic surface net may be provided by forming a metal-terminated surface of the substrate on which the ruthenium film may subsequently be formed. The metal-terminated surface may be formed by either an additive process or a subtractive process. For an additive process, a high oxygen affinity metal, such as aluminum or chromium, may be applied to the sapphire substrate to form the metal-terminated surface before deposition of a ruthenium film. By way of example, one or more monolayers as calculated by a growth rate and growth time of the high oxygen affinity metal may be deposited to effectively provide the metal-terminated surface. In certain embodiments, the high oxygen affinity metal is applied to the substrate in a common vacuum or ultra-high vacuum deposition system that is also used for deposition of the ruthenium film, thereby reducing oxidation of the metal-terminated surface before the ruthenium film may be formed. For a subtractive process involving an insulating substrate such as sapphire, the metal-terminated surface may be provided by reducing oxygen from a face of the substrate to provide an aluminum-terminated surface. By way of example, a hydrogen ion beam may be applied to the typical oxygen-terminated surface to form the aluminum-terminated surface prior to deposition of the ruthenium film.

Figure 1A:
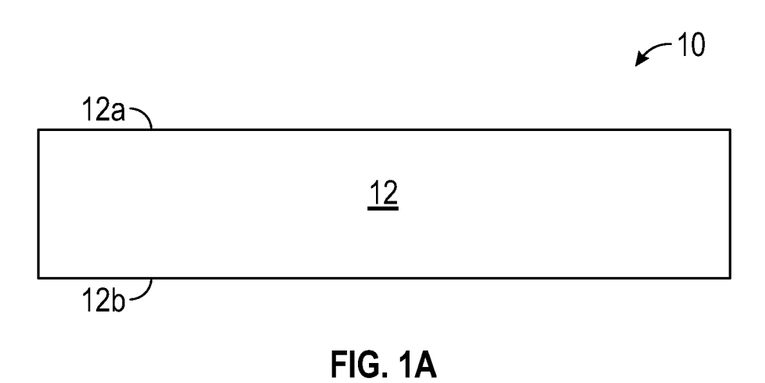
FIG. 1A is a cross-sectional view of a device at a fabrication step where a substrate is provided before deposition of a ruthenium film.
Figure 1B:
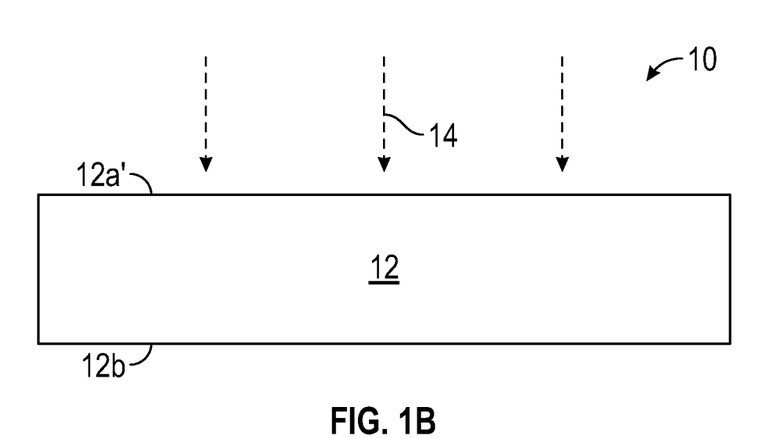
FIG. 1B is a cross-sectional view of the device of FIG. 1A at a fabrication step where a surface treatment is applied that forms an altered substrate face having a different crystallographic surface net than the original substrate face of FIG. 1A.
Figure 1C:
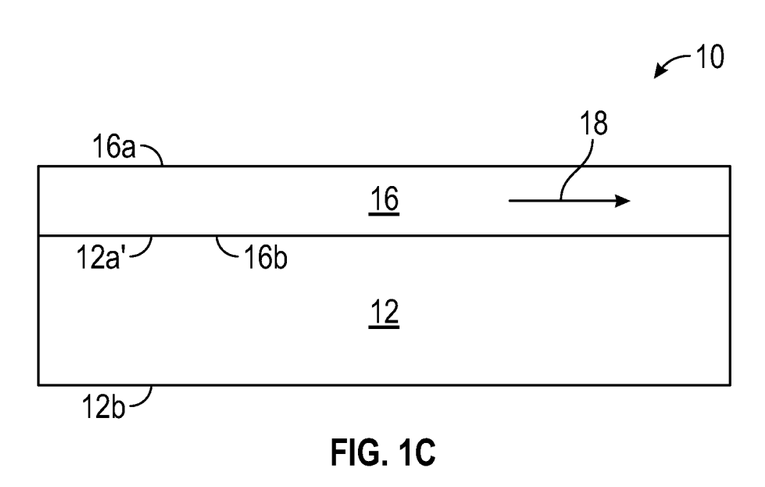
FIG. 1C is a cross-sectional view of the device of FIG. 1B at a fabrication step after deposition of a ruthenium film.

FIGS. 1A-1C are cross-sectional views representing processing steps for forming a device 10 that includes a substrate 12 and a ruthenium film 16 having a c-axis 18 orientation configured to provided reduced electrical resistivity in a lateral direction. In various applications, the device 10 may comprise a semiconductor device including conductive interconnects. FIG. 1A is a cross-sectional view of the device 10 where the substrate 12 is provided before deposition of the ruthenium film 16. The substrate 12 includes a first face 12a and a second face 12b that opposes the first face 12a. In this regard, the first face 12a forms a growth face on which the ruthenium film 16 may be deposited. In certain embodiments, the substrate 12 comprises a sapphire substrate having one of a $(11\bar{2}0)$ or $(10\bar{1}0)$ orientation. Accordingly, the first face 12a comprises an oxygen-terminated surface of the substrate 12 with a hexagonal crystallographic surface net.

FIG. 1B is a cross-sectional view of the device 10 illustrating a surface treatment 14 that forms an altered first face 12a' having a different crystallographic surface net than the original first face 12a of FIG. 1A. In certain embodiments, the surface treatment 14 comprises an additive process. For example, the surface treatment 14 may comprise application of a high oxygen affinity metal, such as aluminum or chromium, to the substrate 12 thereby forming a metal-terminated surface at the altered first face 12a'. To form the metal-terminated surface, sufficient deposition conditions are provided such that one or more monolayers as calculated by a deposition rate and time are formed. In certain embodiments, deposition conditions may be provided such that a range from 0.7 monolayers to 3 monolayers are provided. If the deposition conditions for the high oxygen affinity metal are applied to the substrate 12 for too long, polycrystalline metal could form on the substrate 12 that would have lattice parameters insufficient for growth of the ruthenium film 16. In other embodiments, the surface treatment 14 comprises a subtractive process. For example where the substrate comprises sapphire, the metal-terminated surface may be provided by reducing oxygen from the altered first face 12a' to provide an aluminum-terminated surface of the substrate 12. In certain embodiments, a hydrogen ion beam may be applied to remove oxygen and form the aluminum-terminated surface.

FIG. 1C is a cross-sectional view of the device 10 after deposition of the ruthenium film 16. The ruthenium film 16 may comprise an epitaxial film that is provided on the altered first face 12a' of the substrate 12 and the ruthenium film 16 comprises a first surface 16a and a second surface 16b that generally opposes the first surface 16a. As illustrated, the second surface 16b is provided closer to the substrate 12 than the first surface 16a. In certain embodiments, the second surface 16b is formed directly on the altered first face 12a' of the substrate and in other embodiments, one or more intervening layers may be provided therebetween. According to the surface treatment 14 of FIG. 1B, the altered first face 12a' is provided with a sufficient crystallographic surface net to promote a crystal orientation of the ruthenium film 16 that orients the c-axis 18 in a direction that is non-perpendicular with the altered first face 12a' and the first surface 16a. In various embodiments, the c-axis 18 may comprise an orientation that is in-plane with the ruthenium film 16. For embodiments where the substrate 12 comprises sapphire, the crystallographic surface net may comprise a rectangular surface net for the substrate 12. In certain embodiments, the ruthenium film 16 may comprise a crystallographic orientation such that the c-axis 18 is no more than 10 degrees from parallel to the second surface 16b. In further embodiments, the c-axis 18 may be parallel to the second surface 16b. To prevent oxidation after the metal-terminated surface is formed at the altered first face 12a', the ruthenium film 16 may be epitaxially deposited in a same system that is used to provide the surface treatment 14. By way of example, a common system may include a sputtering system that is configured to rapidly toggle or shutter between application of the high oxygen affinity metal and deposition of the ruthenium film 16. The deposition environment may comprise a vacuum pressure or an ultra-high vacuum pressure, such as a base pressure in a $10^{-10}$ torr range to a $10^{-9}$ torr range. A deposition temperature for the ruthenium film 16 may comprise a range from 350° C. to 750° C., depending on the system. In other embodiments, the surface treatment 14 and the ruthenium film 16 may be provided by other thin film epitaxial deposition techniques, including one or more of electroplating, evaporation, chemical vapor deposition, or metal organic chemical vapor deposition. In still further embodiments, the substrate 12 may be selected such that the first face (12a of FIG. 1) provides a sufficient crystallographic surface net to promote a crystal orientation of the ruthenium film 16 that orients the c-axis 18 in a direction that is non-perpendicular to the first face (12a of FIG. 1) without requiring the surface treatment 14 of FIG. 1B.

Figure 2:
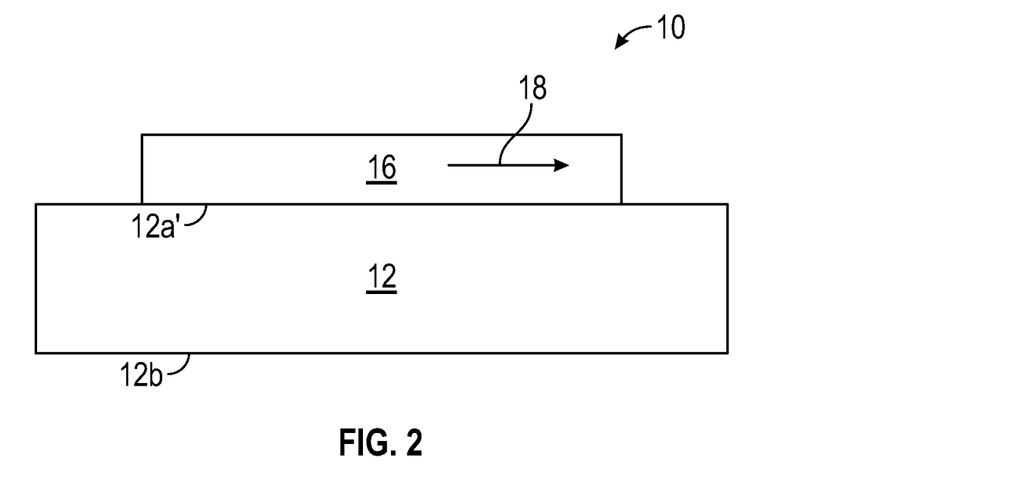
FIG. 2 is a cross-sectional view of the device of FIG. 1C after selectively forming or patterning the ruthenium film on the substrate.

FIG. 2 is a cross-sectional view of the device 10 of FIG. 1C after selectively forming or patterning the ruthenium film 16 on the substrate 12. In various applications, the ruthenium film 16 may be configured to form one or more electrical interconnects for the device 10. In this regard, the ruthenium film 16 may be selectively formed in a pattern by either depositing the ruthenium film 16 through a patterned mask or by blanket-depositing the ruthenium film 16 on the substrate and selectively removing portions thereof.

While the above-described embodiments illustrate ruthenium films formed on substrate surfaces that are configured to promote c-axis in-plane orientations of the ruthenium films, the principles described herein are not so limited. In certain embodiments, one or more intervening layers or interlayers may be provided between a ruthenium film and a corresponding substrate. In this regard, a top surface of the one or more interlayers may be provided with an appropriate surface net that promotes a c-axis in-plane orientation of a ruthenium film formed thereon. The one or more interlayers may include one or more of insulating layers, metal layers, and epitaxial layers. For example, the one or more interlayers may include one or more sapphire layers that are formed on a sapphire substrate, where a top surface of the one or more sapphire layers is metal-terminated as previously described. Additionally, the substrate may comprise other materials, such as silicon and the one or more interlayers may include a silicide that is formed on the silicon substrate.

Figure 3:
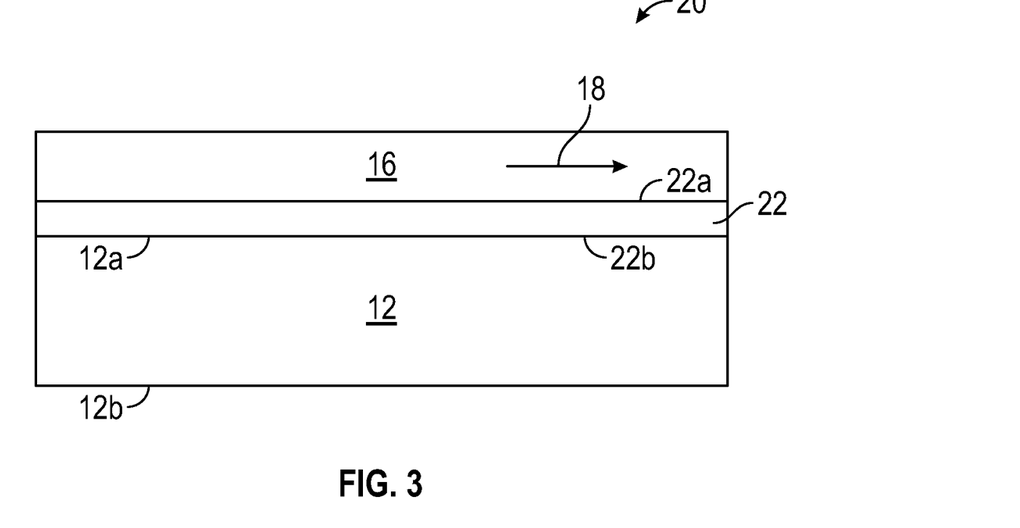
FIG. 3 is a cross-sectional view of a device that includes one or more interlayers that are provided between a substrate and a ruthenium film.

FIG. 3 is a cross-sectional view of a device 20 that includes one or more interlayers 22 that are provided between the substrate 12 and the ruthenium film 16. In various applications, the device 20 may comprise a semiconductor device including conductive interconnects. In certain embodiments, the one or more interlayers 22 may comprise sapphire that is deposited or otherwise formed on the first face 12a of the substrate 12. As illustrated, a first surface 22a of the one or more interlayers 22 is provided distal to a second surface 22b of the one or more interlayers 22 that is arranged at the substrate 12. In this regard, the surface treatment 14 of FIG. 1B may be applied to the first surface 22a of the one or more interlayers 22 to form a metal-terminated surface that promotes c-axis in-plane growth of the ruthenium film as described for FIG. 1C. In other embodiments, the substrate 12 may comprise silicon and the one or more interlayers 22 may comprise a silicide at the first surface 22a of the one or more interlayers 22 that promotes c-axis in-plane growth of the ruthenium film 16. In other embodiments, it is contemplated that other substrate materials and interlayer materials may be used that configure the first surface 22a or the first face 12a with a suitable crystallographic surface net that promotes c-axis in-plane orientations of the ruthenium film 16.

Figure 4:
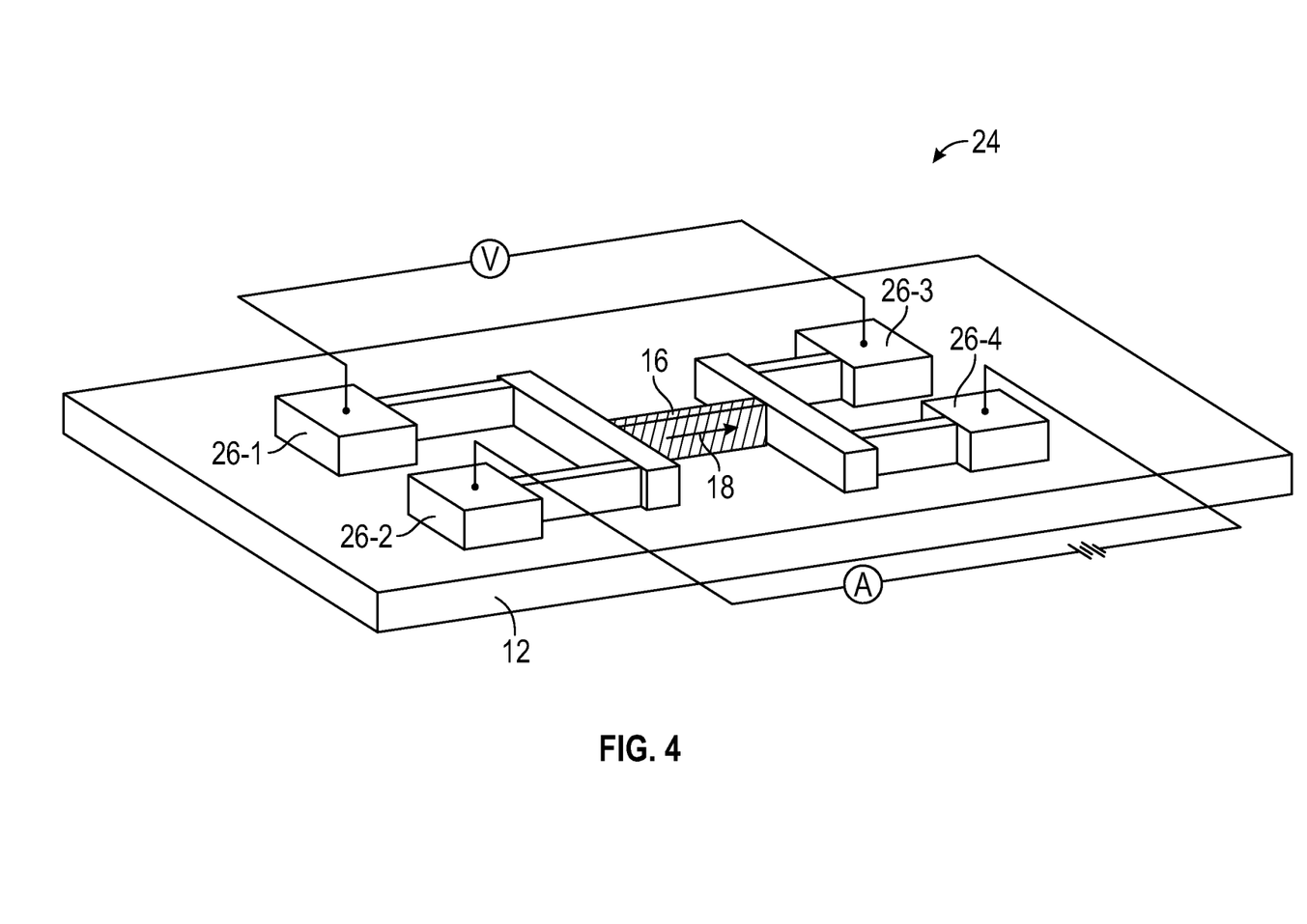
FIG. 4 is a perspective view of a device that includes a ruthenium film that is configured for a four-point terminal measurement of the electrical resistance of the ruthenium film.

FIG. 4 is a perspective view of a device 24 that includes the ruthenium film 16 and is configured for a four-point terminal measurement of the electrical resistance of the ruthenium film 16. As with other embodiments, the device 24 may comprise a semiconductor device including conductive interconnects. The device 24 includes four terminals 26-1 to 26-4 that are provided on the substrate 12. For a four-point terminal measurement, the terminals 26-1, 26-3 may be configured as voltage terminals on opposing sides of the ruthenium film 16, and the terminals 26-2, 26-4 may be configured as current terminals that are also on opposing sides of the ruthenium film 16. In this regard, a resistance of the ruthenium film 16 may be measured that does not include any electrical lead or contact resistance. As illustrated, by configuring the c-axis 18 of the ruthenium film 16 with an orientation that corresponds to a direction of electrical current, an electrical resistance of the ruthenium film 16 will be substantially improved compared with a typical ruthenium film of the same dimensions having a c-axis that is perpendicular to a direction of electrical current.

Figure 5A:
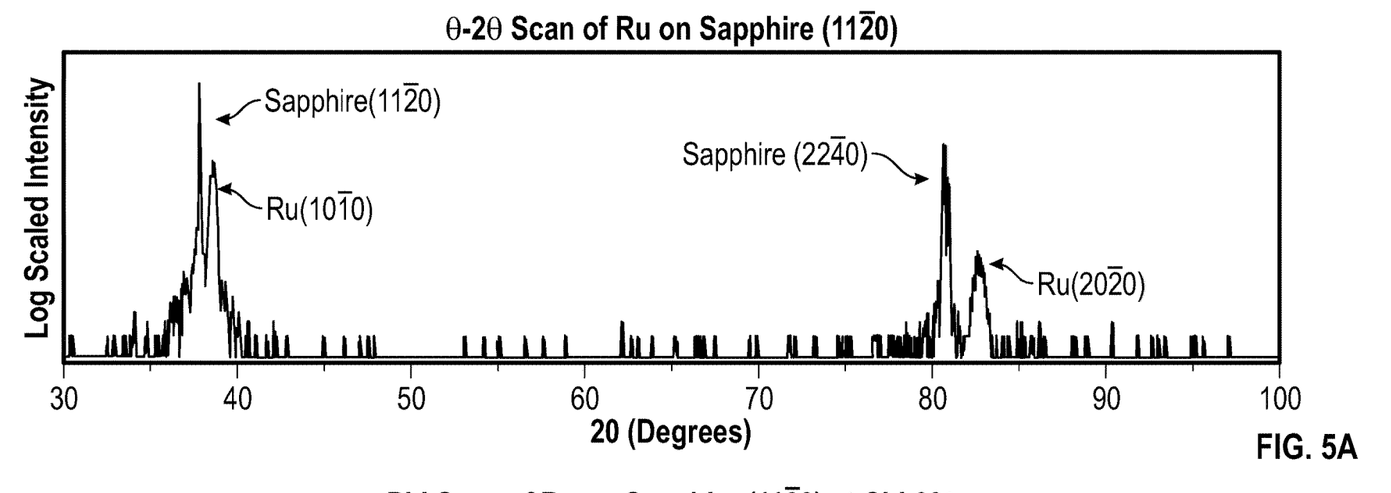
FIG. 5A and FIG. 5B illustrate x-ray diffraction measurements of symmetric specular and phi scans respectively of a single crystal ruthenium film having an $(10\bar{1}0)$ orientation on a sapphire substrate having an $(11\bar{2}0)$ orientation.
Figure 5B:
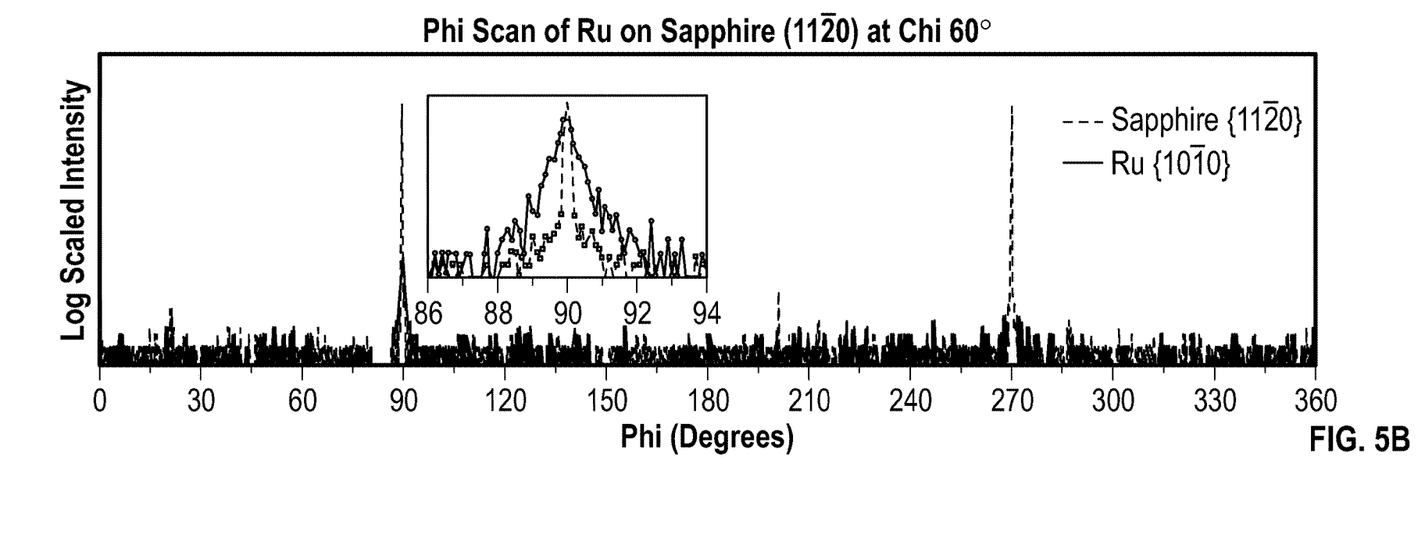
Figure 6A:
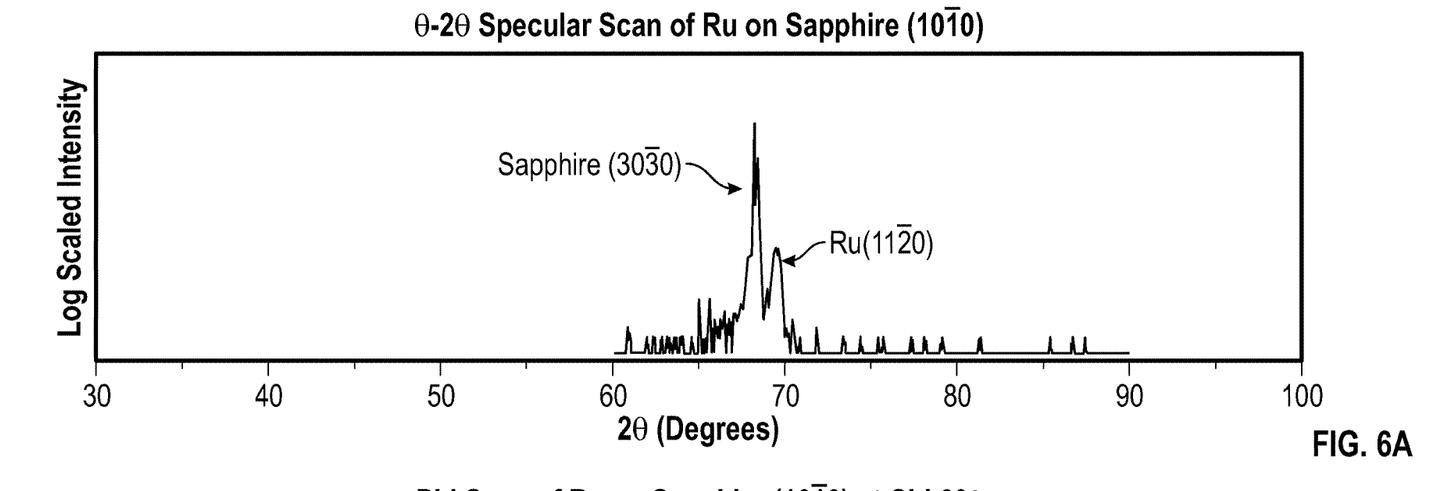
FIG. 6A and FIG. 6B illustrate x-ray diffraction measurements of symmetric specular and phi scans respectively of a single crystal ruthenium film having an $(11\bar{2}0)$ orientation on a sapphire substrate having an $(10\bar{1}0)$ orientation.
Figure 6B:
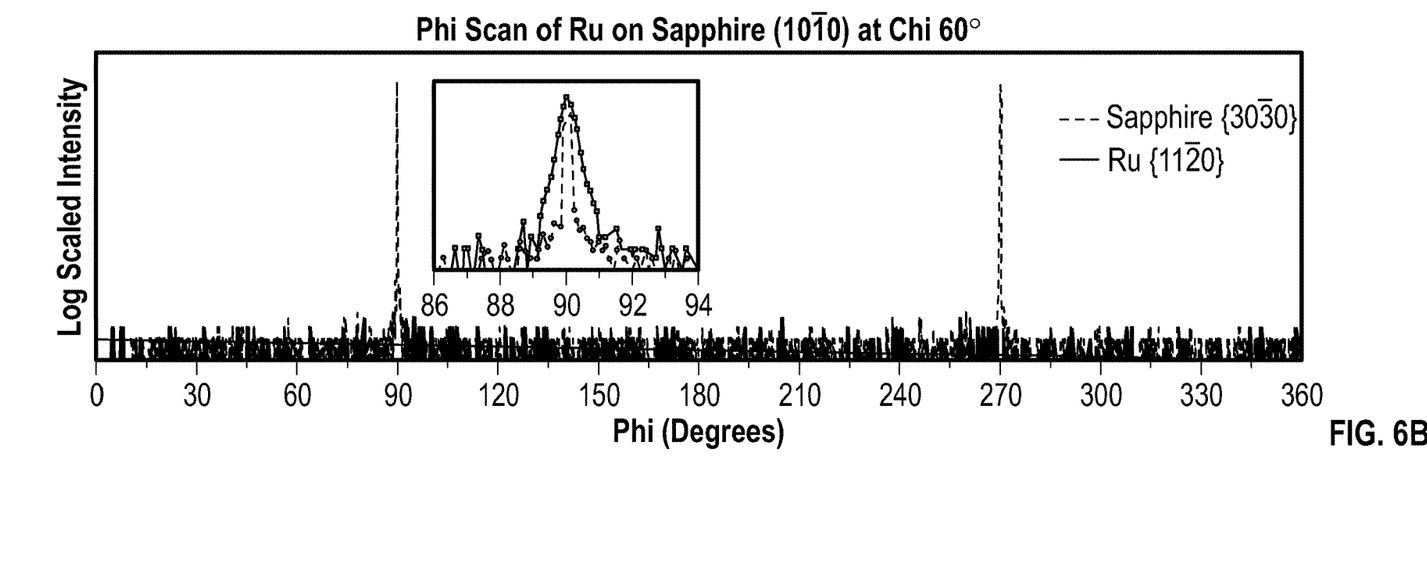

According to embodiments disclosed herein, exemplary epitaxial single crystal ruthenium films were formed on sapphire substrates, including (10$\bar{1}$0) and (11$\bar{2}$0) crystallographic orientations of ruthenium on (11$\bar{2}$0) and (10$\bar{1}$0) crystallographic orientations of sapphire. In certain embodiments, the exemplary epitaxial ruthenium films may also comprise a 30 degree relative rotation, e.g., a rotated honeycomb, about the in-plane c-axis. FIG. 5A and FIG. 5B illustrate x-ray diffraction measurements of symmetric specular and phi scans respectively of a single crystal ruthenium film having an (10$\bar{1}$0) orientation on a sapphire substrate having an (11$\bar{2}$0) orientation. FIG. 5A illustrates that the (10$\bar{1}$0) plane of ruthenium is parallel to the surface of the (11$\bar{2}$0) sapphire. FIG. 5B illustrates an angled 360 degree scan to detect the {10$\bar{1}$0} family of ruthenium planes present on the (11$\bar{2}$0) sapphire. FIG. 5B also includes an angled 360 degree scan to detect the {11$\bar{2}$0} planes of the sapphire substrate. In a similar manner, FIG. 6A and FIG. 6B illustrate x-ray diffraction measurements of symmetric specular and phi scans respectively of a single crystal ruthenium film having an (11$\bar{2}$0) orientation on a sapphire substrate having an (10$\bar{1}$0) orientation. FIG. 6A illustrates that the (11$\bar{2}$0) plane of ruthenium is parallel to the surface of the (10$\bar{1}$0) sapphire. FIG. 6B illustrates an angled 360 degree scan to detect the {11$\bar{2}$0} family of ruthenium planes present on the (10$\bar{1}$0) sapphire. FIG. 6B also includes an angled 360 degree scan to detect the orientation of the {10$\bar{1}$0} planes of the sapphire substrate.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A device comprising:
a substrate comprising a first face and a second face that opposes the first face, wherein the substrate comprises sapphire and the first face of the substrate comprises a metal-terminated surface or wherein the substrate comprises silicon and a silicide and the first face is a surface of the silicide; and
a ruthenium film on the first face, the ruthenium film comprising a first surface and a second surface that opposes the first surface, the first surface being arranged closer to the first face of the substrate than the second surface, and the ruthenium film comprising an epitaxial film with a crystallographic orientation such that a c-axis of the ruthenium film is no more than 10 degrees from parallel to the second surface.

2. The device of claim 1, wherein the c-axis is parallel to the second surface.

3. The device of claim 1, wherein the substrate comprises the sapphire and the first face of the substrate comprises the metal-terminated surface.

4. The device of claim 3, wherein the metal-terminated surface comprises a crystallographic surface net that is configured to provide the crystallographic orientation of the ruthenium film.

5. The device of claim 4, wherein the crystallographic surface net comprises a rectangular surface net.

6. The device of claim 5, wherein the ruthenium film comprises a rectangular surface net at the second surface.

7. The device of claim 3, wherein the metal-terminated surface comprises aluminum.

8. The device of claim 3, wherein the metal-terminated surface comprises chromium.

9. The device of claim 1, wherein the substrate comprises the silicon and the silicide and the first face is the surface of the silicide.

10. The device of claim 1, wherein the ruthenium film comprises a single crystalline layer of ruthenium.

11. The device of claim 1, wherein the ruthenium film comprises a (11$\bar{2}$0) crystallographic orientation or a (10$\bar{1}$0) crystallographic orientation.

12. The device of claim 1, wherein the ruthenium film forms an interconnect wire.

13. The device of claim 1, wherein the ruthenium film forms an interconnect wire of a semiconductor device.

14. A device comprising:
a substrate comprising a first face and a second face that opposes the first face, wherein the substrate comprises sapphire and the first face of the substrate comprises a metal-terminated surface or wherein the substrate comprises silicon and a silicide and the first face is a surface of the silicide; and
a ruthenium film on the first face, the first face comprising a crystallographic surface net that is configured to provide a crystallographic orientation of the ruthenium film such that a c-axis of the ruthenium film is no more than 10 degrees from parallel to the first face.

15. The device of claim 14, wherein the c-axis is parallel to the second face.

16. The device of claim 14, wherein the substrate comprises the sapphire and the first face of the substrate comprises the metal-terminated surface.

17. The device of claim 16, wherein the metal-terminated surface comprises one of aluminum and chromium.

18. The device of claim 17, wherein the ruthenium film forms an interconnect wire of a semiconductor device.

19. A method of forming a device, the method comprising:
providing a substrate comprising a first face and a second face that opposes the first face, wherein the substrate comprises sapphire and the first face of the substrate comprises a metal-terminated surface or wherein the substrate comprises silicon and a silicide and the first face is a surface of the silicide; and
providing a ruthenium film on the first face, the ruthenium film comprising a first surface and a second surface that opposes the first surface, the first surface being arranged closer to the first face of the substrate than the second surface, and the ruthenium film comprising an epitaxial film with a crystallographic orientation such that a c-axis of the ruthenium film is no more than 10 degrees from parallel to the second surface.

20. The device of claim 19, wherein the c-axis is parallel to the second surface.

21. The method of claim 19, wherein the substrate comprises the sapphire and the method further comprises providing the metal-terminated surface at the first face of the substrate.

22. The method of claim 21, wherein the metal-terminated surface comprises a crystallographic surface net that is configured to provide the crystallographic orientation of the ruthenium film.

23. The method of claim 22, wherein providing the metal-terminated surface comprises supplying the metal to the first face of the substrate.

24. The method of claim 23, wherein the metal comprises at least one of aluminum or chromium.

25. The method of claim 23, wherein supplying the metal to the first face of the substrate and providing the ruthenium film are performed in consecutive steps within a same deposition system.

26. The method of claim 22, wherein providing the metal-terminated surface comprises removing oxygen from the first face of the substrate.

* * * * *